(12) United States Patent
Sharma et al.

(10) Patent No.: US 11,217,323 B1
(45) Date of Patent: Jan. 4, 2022

(54) CIRCUIT AND METHOD FOR CAPTURING AND TRANSPORTING DATA ERRORS

(71) Applicant: STMicroelectronics International N.V., Geneva (CH)

(72) Inventors: Vivek Mohan Sharma, New Delhi (IN); Deepak Baranwal, Greater Noida (IN); Nicolas Bernard Grossier, Oreno di Vimercate (IT); Samiksha Agarwal, New Delhi (IN)

(73) Assignee: STMicroelectronics International N.V., Geneva (CH)

(*) Notice: Subject to any disclaimer, the term of this patent is extended or adjusted under 35 U.S.C. 154(b) by 0 days.

(21) Appl. No.: 17/010,272

(22) Filed: Sep. 2, 2020

(51) Int. Cl.
| | |
|---|---|
| G11C 16/06 | (2006.01) |
| G11C 29/10 | (2006.01) |
| G11C 29/44 | (2006.01) |
| G06F 13/16 | (2006.01) |
| G11C 29/42 | (2006.01) |

(52) U.S. Cl.
CPC .......... G11C 29/10 (2013.01); G06F 13/1605 (2013.01); G06F 13/1689 (2013.01); G11C 29/42 (2013.01); G11C 29/44 (2013.01); *G11C 2029/4402* (2013.01)

(58) Field of Classification Search
CPC ......... G11C 29/10; G11C 29/42; G11C 29/44; G11C 2029/4402; G06F 13/1605; G06F 13/1689
USPC .................................................... 365/185, 9
See application file for complete search history.

(56) References Cited

U.S. PATENT DOCUMENTS

| | | | |
|---|---|---|---|
| 4,916,704 A | 4/1990 | Bruckert et al. | |
| 5,404,462 A | 4/1995 | Datwyler et al. | |
| 5,592,631 A | 1/1997 | Kelly et al. | |
| 7,043,673 B1 | 5/2006 | Ichiriu et al. | |
| 7,620,875 B1 | 11/2009 | Nelson et al. | |
| 7,716,521 B1 * | 5/2010 | Donahue | G06F 11/0724 714/11 |
| 7,761,763 B2 | 7/2010 | Shin et al. | |

(Continued)

OTHER PUBLICATIONS

Texas Instruments, Ghone, C. et al., "ECC/EDC on TDAxx", Application Report, SPRAC42B—Jul. 2016—Revised Jun. 2018, 29 pages.

(Continued)

*Primary Examiner* — Viet Q Nguyen
(74) *Attorney, Agent, or Firm* — Slater Matsil, LLP

(57) ABSTRACT

In an embodiment, a method includes: receiving, with a first buffer of a first error compactor unit (ECU), a first memory error packet associated with a first memory; receiving, with the first buffer, a second memory error packet associated with a second memory; transmitting a first reading request for reading the first memory error packet; receiving the first reading request with an arbiter of an error aggregator unit (EAU) of a central memory error management unit (MEMU); in response to receiving the first reading request, reading the first memory error packet from the first buffer, transmitting the first memory error packet to a controller of the central MEMU, and transmitting a first acknowledgement to the first ECU; receiving the first acknowledgement with the first ECU; and in response to receiving the first acknowledgement, transmitting a second reading request for reading the second memory error packet.

25 Claims, 9 Drawing Sheets

(56) References Cited

U.S. PATENT DOCUMENTS

| | | | |
|---|---|---|---|
| 7,958,433 | B1 | 6/2011 | Yoon et al. |
| 7,987,407 | B2 | 7/2011 | Gille et al. |
| 8,437,183 | B2 | 5/2013 | Sharon et al. |
| 9,063,874 | B2 * | 6/2015 | Zhong ............... G06F 11/1008 |
| 9,142,322 | B2 * | 9/2015 | Baranwal ............ G11C 29/08 |
| 9,189,329 | B1 | 11/2015 | Zhu et al. |
| 9,432,298 | B1 * | 8/2016 | Smith ............... H04L 49/9057 |
| 9,612,901 | B2 | 4/2017 | Ruggiero et al. |
| 9,665,423 | B2 | 5/2017 | Beattie et al. |
| 9,690,650 | B2 | 6/2017 | Liu et al. |
| 9,766,681 | B2 * | 9/2017 | Solihin ............... H04W 52/48 |
| 9,864,654 | B2 * | 1/2018 | Vishne ............... G06F 11/1076 |
| 10,127,983 | B1 * | 11/2018 | Peterson ............ G06F 11/1004 |
| 2004/0167992 | A1 * | 8/2004 | Carnevale ............ H04L 1/1607 709/250 |
| 2008/0244146 | A1 * | 10/2008 | Das .................... G06F 13/4247 710/309 |
| 2008/0263385 | A1 | 10/2008 | Dudeck et al. |
| 2009/0132876 | A1 * | 5/2009 | Freking ............ G11C 29/56008 714/723 |
| 2009/0249154 | A1 * | 10/2009 | Sasaki ................. H04L 1/1829 714/748 |
| 2011/0145469 | A1 * | 6/2011 | Choi .................... H04L 1/16 710/314 |
| 2011/0289381 | A1 | 11/2011 | Daga et al. |
| 2012/0124448 | A1 | 5/2012 | Emerson et al. |
| 2013/0179753 | A1 * | 7/2013 | Flynn ................. G06F 11/1044 714/773 |
| 2014/0040512 | A1 | 2/2014 | Fernald |
| 2014/0201597 | A1 | 7/2014 | Hoekstra et al. |
| 2014/0245105 | A1 | 8/2014 | Chung et al. |
| 2017/0185539 | A1 | 6/2017 | Xu et al. |
| 2018/0203759 | A1 | 7/2018 | Shaeffer et al. |
| 2019/0332469 | A1 | 10/2019 | Radjai et al. |
| 2019/0347159 | A1 * | 11/2019 | Chang ................. G11C 29/42 |
| 2020/0349001 | A1 * | 11/2020 | Hartlieb ............. G06F 11/1048 |

OTHER PUBLICATIONS

National Instruments, "What is the ISO 26262 Functional Safety Standard?", http://www.ni.com/white-paper/13647/en/, Apr. 3, 2014, 5 pages.

Yoon, Doe Hyun et al., "Memory Mapped ECC: Low-Cost Error Protection for Last Level Caches", ISCA'09, Jun. 20-24, 2009, Austin, TX, 12 pages.

* cited by examiner

CIRCUIT AND METHOD FOR CAPTURING AND TRANSPORTING DATA ERRORS

TECHNICAL FIELD

The present disclosure relates generally to an electronic system and method, and, in particular embodiments, to a circuit and method for capturing and transporting data errors.

BACKGROUND

The complexity of integrated circuits (ICs) has increased steadily in recent years. Some ICs include a plurality of circuits. For example, a system-on-a-chip (SoC) may integrate all components of a computer or another electronic system on a chip to, e.g., perform a number of functions, such as receiving and sending data, receiving and making phone calls, playing virtual games, etc. For example, a microcontroller IC may include, in addition to a central processing unit (CPU) and associated registers, a plurality of memories for, e.g., software storage, analog-to-digital converters (ADCs), digital-to-analog converters (DACs), communication interface modules, such as SPI and I²C, internal oscillators, as well as other digital and analog circuits. Other examples of complex ICs include field programmable gate arrays (FPGAs), power management ICs (PMICs), processors (such as ARM or x86 processors), digital signal processors (DSPs), etc.

Some applications are considered safety critical and demand self-test and/or real time monitoring of its circuits during mission mode (during normal operation), or during start/stop of the application in the field. An example is an automotive grade application controlling safety mechanism such as Braking, Parking, Lane change, etc.

Complex ICs may include a built-in-self-test (BIST) circuit. A BIST circuit, (also referred to as built-in test circuit, or BIT circuit), is a test circuit included in the complex IC that allows such complex IC to test itself. BIST circuits may be used to assist automatic test equipment (ATE), e.g., by testing logical or memory functions, or improve coverage or other test performance during manufacturing (production) of the IC.

BIST circuits may also be used in the field (e.g., during start/stop). For example, an automotive grade microcontroller may use BIST to test different components of the microcontroller each time the car is started, and report any detected faults to a central processing unit of the car.

During normal operation, circuits, such as complex ICs may use error-correcting code (ECC) to detect and correct errors.

SUMMARY

In accordance with an embodiment, a method for capturing memory errors includes: receiving, with a first buffer of a first error compactor unit (ECU) circuit, a first memory error packet associated with a first memory; receiving, with the first buffer, a second memory error packet associated with a second memory; transmitting a first reading request for reading the first memory error packet; receiving the first reading request with an arbiter circuit of an error aggregator unit (EAU) circuit of a central memory error management unit (MEMU) circuit; in response to receiving the first reading request, reading the first memory error packet from the first buffer, transmitting the first memory error packet to a controller of the central MEMU circuit, and transmitting a first acknowledgement to the first ECU circuit; receiving the first acknowledgement with the first ECU circuit; and in response to receiving the first acknowledgement, transmitting a second reading request for reading the second memory error packet.

In accordance with an embodiment, a circuit includes: a central memory error management unit (MEMU) circuit including an error aggregator unit (EAU) circuit; an error compactor unit (ECU) circuit coupled to the EAU circuit, the ECU circuit having a buffer; and first and second memories coupled to the ECU circuit, where the ECU circuit is configured to: receive, with the buffer, a first memory error packet from the first memory, receive, with the buffer, a second memory error packet from the second memory, make available in a parallel bus the first memory error packet and transmit a first reading request for reading the first memory error packet to the EAU circuit, after transmitting the first reading request, receive a first acknowledgement, and in response to receiving the first acknowledgement, make available in the parallel bus the second memory error packet and transmit a second reading request for reading the second memory error packet to the EAU.

In accordance with an embodiment, an integrated circuit includes: a central memory error management unit (MEMU) circuit including an error aggregator unit (EAU) circuit; a plurality of error compactor unit (ECU) circuits, each ECU circuit of the plurality of ECU circuits including a respective first-in-first-out (FIFO) buffer coupled to a respective parallel bus coupled to the EAU; and a plurality of memories divided into respective sub-groups, each sub-group coupled to a respective ECU circuit of the plurality of ECU circuits, where each ECU circuit of the plurality of ECU circuits is configured to: receive memory error packets from one or more memories of the respective sub-group, store the memory error packets in the respective FIFO buffer, when the respective FIFO buffer is not empty, make available in the respective parallel bus a next memory error packet stored in the FIFO buffer and transmit to the EAU a reading request, after transmitting the reading request, receive an acknowledgement, and in response to receiving the acknowledgement, make available in the respective parallel bus a next memory error packet stored in the FIFO buffer and transmit to the EAU a new reading request.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
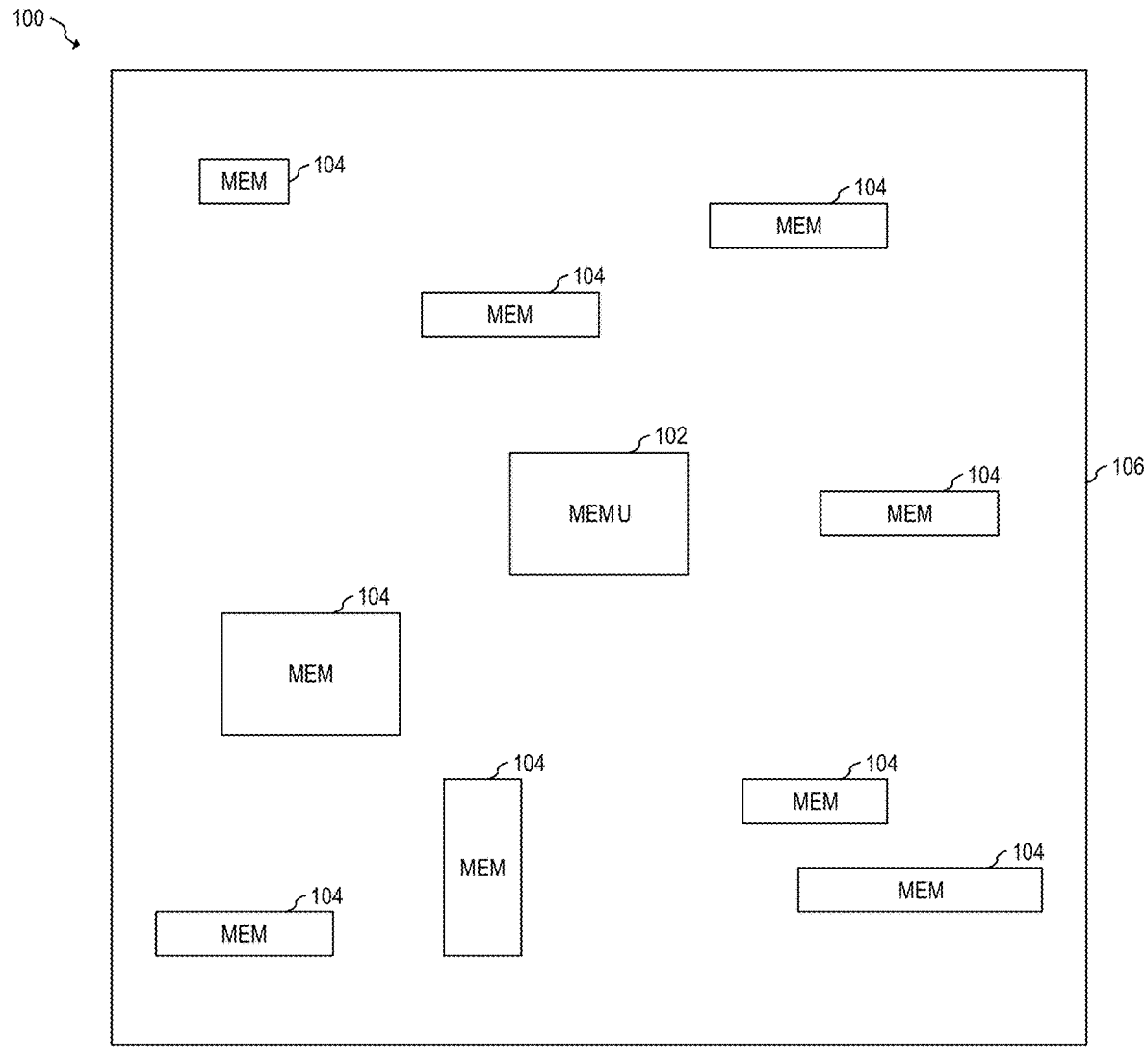
FIG. 1 shows an exemplary floorplan of an SoC, according to an embodiment of the present invention.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials or the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, a circuit and method for capturing and transporting memory errors in a safety critical application, such as in a car. Embodiments of the present invention may be used in other types of safety-critical applications, such as industrial applications, as well as non-safety critical applications, such as a smartphone or table. Some embodiments may also be used for capturing errors different than memory errors.

In an embodiment of the present invention, an IC having a plurality of memories uses a central memory error management unit (MEMU) circuit to store and process error data packets received from the plurality of memories. Data flow control is performed by an asynchronous handshake between a multi-write shared first-in-first-out (FIFO) buffer and the central MEMU circuit to facilitate transmission of the error data packets to the MEMU circuit. In some embodiments, the asynchronous handshake advantageously allows for error data packet flow across different clock domains.

In some embodiments, a synchronous handshake between the FIFO buffer and error packet generators (e.g., BIST or integrity checkers inside one or more memories) is used to backstall the error source from executing further testing until the previous error packet has been acknowledged to be processed (e.g., stored in MEMU).

In some safety-critical applications, memories of an IC may need to be tested in the field at different times. For example, a microcontroller for automotive applications that is compliant with ISO 26262, such as compliant with automotive safety integrity level (ASIL) D, needs to test the integrated memories for faults each time the car starts, as well when the car is on (e.g., while driving). The memories tested at startup and during runtime may be volatile and/or non-volatile.

At startup, memory BIST (MBIST) may be executed to detect correctable and uncorrectable error locations in each memory. Since it is generally desirable to minimize the time to startup a car, the MBIST is generally run at-speed (at maximum speed), and covering multiple (or all) memories in parallel.

During runtime, error-correcting code (ECC) codes, stored along with data, are decoded to detect and report faults associated with the memories.

In some embodiments, MBIST is also run during runtime. For example, in some embodiments, MBIST may be run in response to the detection of one or more ECC errors. For example, upon detection of an ECC error associated with a memory, processes associated with such memory may be stopped, and an MBIST may be performed on such memory.

All memory errors and their characteristics, such as error type (correctable/uncorrectable), error bit position, error address location, and memory identifiers, are sent to a central memory error management unit (MEMU) circuit in the form of error data packets (also referred to as error packets) for logging (storing) and further processing. The logged errors may also be stored and made available, e.g., via an on-board diagnostics (OBD) 2 port.

The error packets may be sent from memories operating in different clock domains, e.g., from 50 MHz, to 500 MHz, and may have a size of dozens of bits. For example, a 32 bit system the error packet width may be, e.g., from 42-52 bits.

In some embodiments, there may be more than 1 type of error packets. For example, some embodiments may have 2 types of error packets: one for the startup memory test (e.g., MBIST) and one for the runtime memory test (e.g., ECC). Some embodiments may also have different types of error packets for non-volatile memories and volatile memories. In some embodiments, all error packets may be of the same type. For example, an embodiment may have four types of error packets associated with non-volatile memories (e.g., single/double/tripler error correction, and multiple error detection).

After receiving errors at startup, the MEMU circuit may report the errors to the user (e.g., via one or more lights in a dashboard and/or a noise) and/or prevent the start of the car). When receiving errors during runtime, the MEMU circuit may report the error to the user, as well as taking other actions.

A complex SoC may include hundreds of volatile memories (e.g., associated systems and peripheral modules), such as of the random-access-memory (RAM) type, as well a plurality of memories of the non-volatile memory type. These memories are placed in different locations of the SoC. For example, FIG. 1 shows an exemplary floorplan of SoC 100, according to an embodiment of the present invention. SoC 100 is implemented as an integrated circuit and includes MEMU circuit 102 and a plurality of memories 104 disposed on a (e.g., monolithic) semiconductor substrate. The plurality of memories 104 may be of different sizes and types (e.g., volatile or non-volatile). Other circuits of SoC 100 are not shown in FIG. 1 for clarity purpose.

Although FIG. 1 shows 9 memories 104, some embodiments have hundreds of memories 104. For example, in some embodiments, SoC 100 may include, e.g., more than 300 volatile memories of the RAM type, and, e.g., more than 10 non-volatile memories, e.g., of the EEPROM type. A different number of memories and other memory types, e.g., flash, OTP, ROM, PCM, etc., may also be used.

In some embodiments, SoC 100 may be, e.g., a microcontroller, processor, DSP, FPGA, or PMIC.

Routing dedicated wires from each memory 104 to MEMU circuit 102 may be challenging. For example, the placement of the interconnects in the various metal layers of SoC 100 to route signals from the memories 104 to MEMU circuit 102 may be challenging in itself. For example, routing 84-104 error bits (e.g., 2 types of error packets, where each error packet has a size between 42 and 52) from each of, e.g., the more than 300 memories 104 may be challenging. Additionally, performing timing closure (the process in which a logic design is modified to meet timing requirements) may also be challenging.

In an embodiment of the present invention, a memory management unit (MEMU) circuit includes an error aggregator unit (EAU) to process error packets from a plurality of memories of a SoC. An error compactor unit (ECU) is used to capture concurrent error packets from a sub-set of the plurality of memories of the SoC and sequentially transfer the error packets to the EAU using a multi-write first-in-first-out (FIFO) buffer. The EAU arbitrates and captures error packets from multiple ECUs for further processing using a handshaking mechanism.

Figure 2:
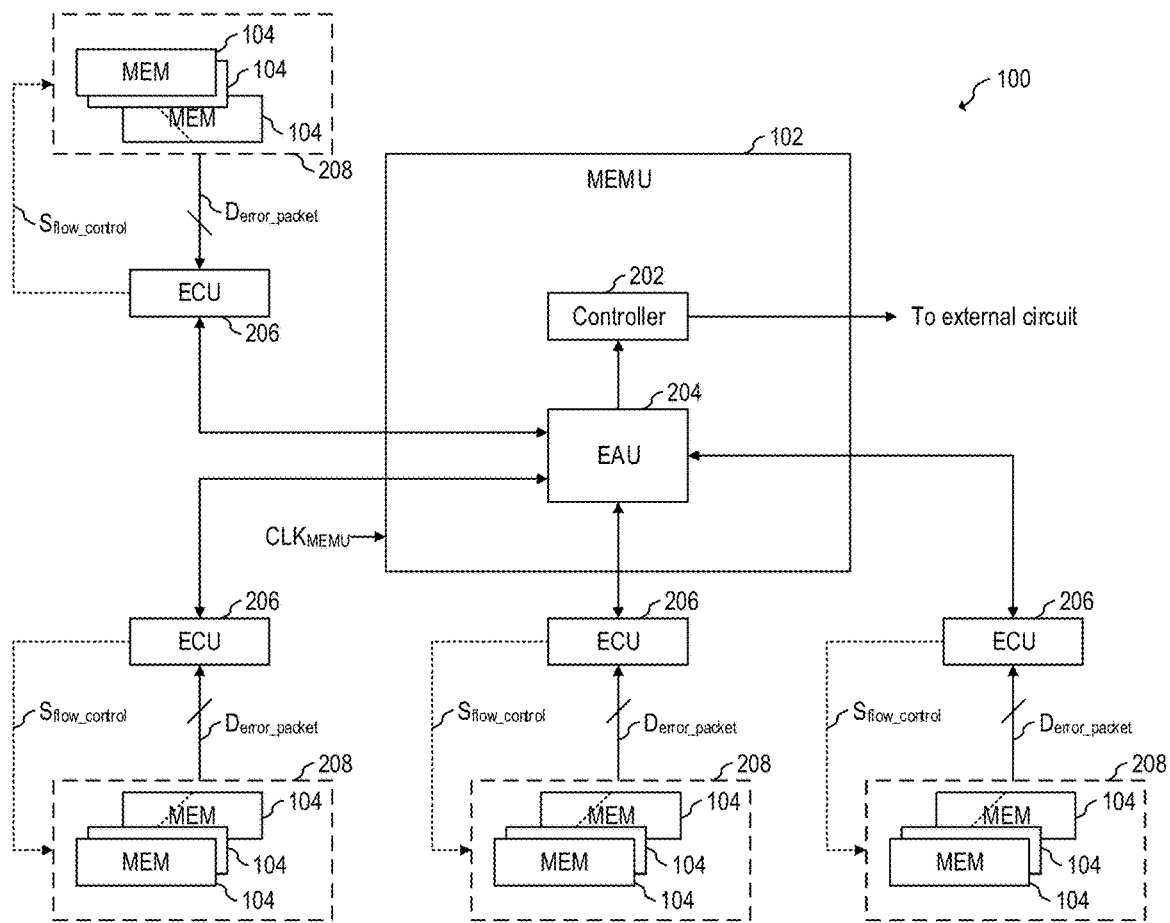
FIG. 2 shows a schematic diagram of the SoC of FIG. 1, according to an embodiment of the present invention.

FIG. 2 shows a schematic diagram of SoC 100, according to an embodiment of the present invention. SoC 100 includes MEMU 102 and ECU 206. MEMU 102 includes controller 202 and EAU 204.

As shown in FIG. 2, the plurality of memories 104 are grouped in sub-groups 208. The number of memories 104 in each sub-group 208 may be the same or different. In some embodiments, each ECU 206 is customized for the number of input sources that it supports.

ECU 206 is configured to capture, e.g., concurrently, error packets and sequentially transfer the error packets to EAU 204 using a handshaking mechanism, which may be synchronous or asynchronous. In some embodiments, ECU also reports to a central fault collection unit when an error packet is lost.

EAU is configured to arbitrate and capture error packets from multiple ECUs for further processing.

During startup, a startup memory test is performed on each memory 104. For example, an MBIST may be performed on each memory 104 of the volatile type, and an integrity test may be performed on each memory 104 of the non-volatile type. Errors detected during the startup memory test are transmitted from each faulty memory 104 to the corresponding ECU 206 in the form of error packets using bus $D_{error\_packet}$. Each ECU 206 receives error packets from the plurality of corresponding memories 104 and stores them in a multi-write shared FIFO. The error packets are then transmitted from each ECU 206 to EAU 204 using a handshaking mechanism and an arbitration process (such as round robin). EAU 204 then transmits the error packets to controller 202. Controller 202 then transmits the error packets to an external circuit, such as a central processing unit of a car (e.g., such as a central fault processing unit or safety faults collection and controller).

During runtime, error-correcting code (ECC) codes are used to detect faults in each memory 104. Detected faults in each memory 104 are transmitted as error packets to the corresponding 206 using bus $D_{error\_packet}$. Each ECU 206 receives error packets from the plurality of corresponding memories 104 and stores them in the multi-write shared FIFO. The error packets are then transmitted from each ECU 206 to EAU 204 using a handshaking mechanism and an arbitration process. EAU 204 then transmits the error packets to controller 202, which then transmits the error packets to an external circuit.

In some embodiments, bus $D_{error\_packet}$ is shared for transmitting error packets at startup and during runtime. In other embodiments, different buses are used for transmitting error packets at startup and during runtime.

In some applications, it may be desirable to minimize the startup time by, e.g., performing the startup memory test at speed (as fast as possible) and by testing multiple (or all) memories 104 in parallel. Performing so many tests in parallel and so fast may cause multiple error packets to be transmitted to each ECU 206 simultaneously. In some cases, the rate of transmission of error packets from each sub-group 206 exceeds the processing capacity of ECUs 206 and EAU 204. For example, in some embodiments, MEMU 102 can read/process 1 error packet per clock period of clock $CLK_{MEMU}$.

In some embodiments, ECU 206 may pause execution of the startup memory test on the corresponding sub-group 208 when, e.g., the respective shared FIFO buffer is full or near full. In some embodiments, ECU 206 signals the corresponding sub-group 208 to pause or resume execution of the startup memory test using signal $S_{flow\_control}$. In some embodiments, each ECU 206 produces an independent signal $S_{flow\_control}$. In other embodiments, a single signal $S_{flow\_control}$ is used to pause or resume execution of the entire IC. Other implementations are also possible.

In some embodiments, stopping execution of the startup test when the shared FIFO buffer is full or near full advantageously allows for preventing the loss of error packets while still performing the startup test as fast as possible.

In some embodiments, each bus $D_{error\_packet}$ is implemented as independent serial buses from each memory 104. In other embodiments, each bus $D_{error\_packet}$ is implemented as independent parallel buses from each memory 104. Other implementations are also possible.

In some embodiments, controller 202 is configured to process and transmit the error packets to an external circuit or to a safety controller, maintain internal records of memory faults, avoid storing the same faults more than once, and/or count errors coming in a certain memory range/modules. Controller 202 may be implemented, e.g., using custom logic, which may include, for example, a state machine and/or combinatorial logic coupled to a memory. Some embodiments may be implemented with a generic core, such as an ARM core, for example. Other implementations are also possible.

MBIST and memory integrity tests may be performed in any way known in the art, such as, e.g., by using a state machine to exercise the memories with predetermined patterns.

ECC tests may be performed in any way known in the art. For example, in some embodiments, ECC is capable of correcting single-bit errors and detecting double-bit errors. In some embodiments, ECC is capable of correcting double-bit errors and detecting triple-bit errors. Other implementations are also possible. In some embodiments, ECC checks are also performed automatically during functional usage of the memory by any other functional unit, e.g., a CPU reading its cache memories during a code execution.

Each memory 104 of the non-volatile memory type includes test circuits (not shown) for performing the memory integrity tests and ECC tests. Each memory 104 of the volatile type includes test circuits (not shown) for performing MBIST tests and ECC tests. Such test circuits may also be referred to as safety monitors. The safety monitors may be implemented in any way known in the art.

Figure 3A:
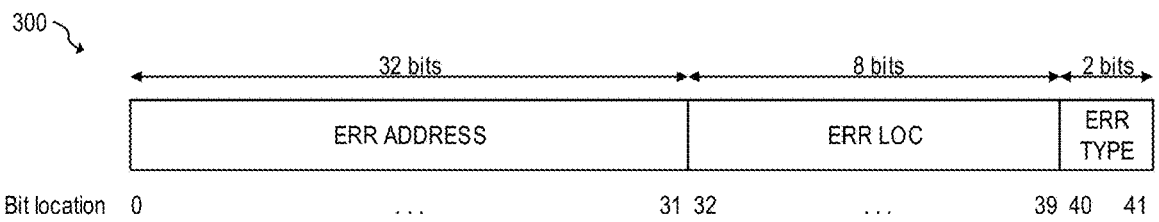
FIGS. 3A and 3B show error packets, according to embodiments of the present invention.

In some embodiments, the error packet may be based on the characteristics of the memories 104. For example, FIG. 3A shows error packet 300, according to an embodiment of the present invention. Error packet 300 is for example suitable for a 32 bit system having 64 bit data.

As shown, error packet 300 has 32 bits for the address location of the detected error, 8 bits for the location of the error at the error address ERR ADDRESS, and 2 bits for the error type (e.g., type of error, such as single error, or double error, and whether the error is correctable or not). In some embodiments, the error packet may have a size different than 42 bits, such as a size between 42 bits and 52 bits. Error packets of other sizes are also possible.

In some embodiments, the error packet may have a different form. For example, in some embodiment, a different number of bits may be allocated to the ERR ADDRESS (e.g., different than 32 bits), ERR LOC (e.g., different than 8 bits), and ERR TYPE (e.g., different than 2 bits), for example. In some embodiments, the error packet may also include additional ERR SRC field to identify the source memory 104 which is causing the error packet generation. In some embodiments, ERR SRC field may aid in performing debugging, as alternative to processing the error address to identify the source memory.

Figure 3B:
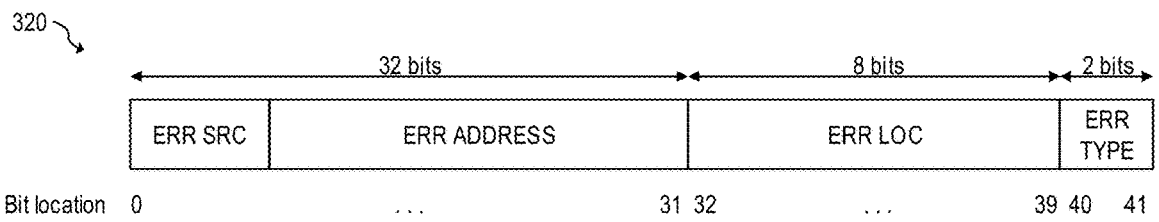

FIG. 3B shows error packet 320, according to an embodiment of the present invention. As shown in FIG. 3B, ERR SRC field may have m bits, and ERR ADDRESS field may have n bits such that m+n is less than or equal to 32. Embodiments implementing error packet 320 may advantageously reduce packet length when SoC 100 has a relatively small number of memories 104 and/or when the size of the memories 104 is small.

In some embodiments, some memories 104 may be larger than others (e.g., as shown in FIG. 1), or may use larger words than others (e.g., 64, 32, 16, or 8 bit words). For example, in some embodiments, some memories 104 may have more than 500 kB, such as 1 MB, or more; and other memories may have only a few kB, such as 10 kB, or less. In some embodiments, all error packets transmitted by each memory 104 have the same form (e.g., such as the error packet form that satisfies the requirements of the biggest memory 104 present in SoC 100).

In some embodiments, different memories 104 may transmit error packets of different forms (e.g., of different sizes). For example, small memories 104 may transmit a smaller error packets (e.g., of 42 bits) while large memories 104 may transmit larger error packets (e.g., of 52 bits).

In some embodiments, some memories 104 may operate in different clock domains. For example, in some embodiments, some memories 104 may operate in a first clock domain (e.g., at a frequency of 200 MHz), and other memories 104 may operate in a second clock domain (e.g., at a frequency of 400 MHz). In some embodiments, all memories 104 of a particular sub-group 208 operate in the same clock domain.

In some embodiments, all memories of a particular sub-group 208 are of the same type. For example, in some embodiments, all memories of a first sub-group 208 are of the EEPROM type; and all memories of a second sub-group 208 are of the RAM type.

Figure 4:
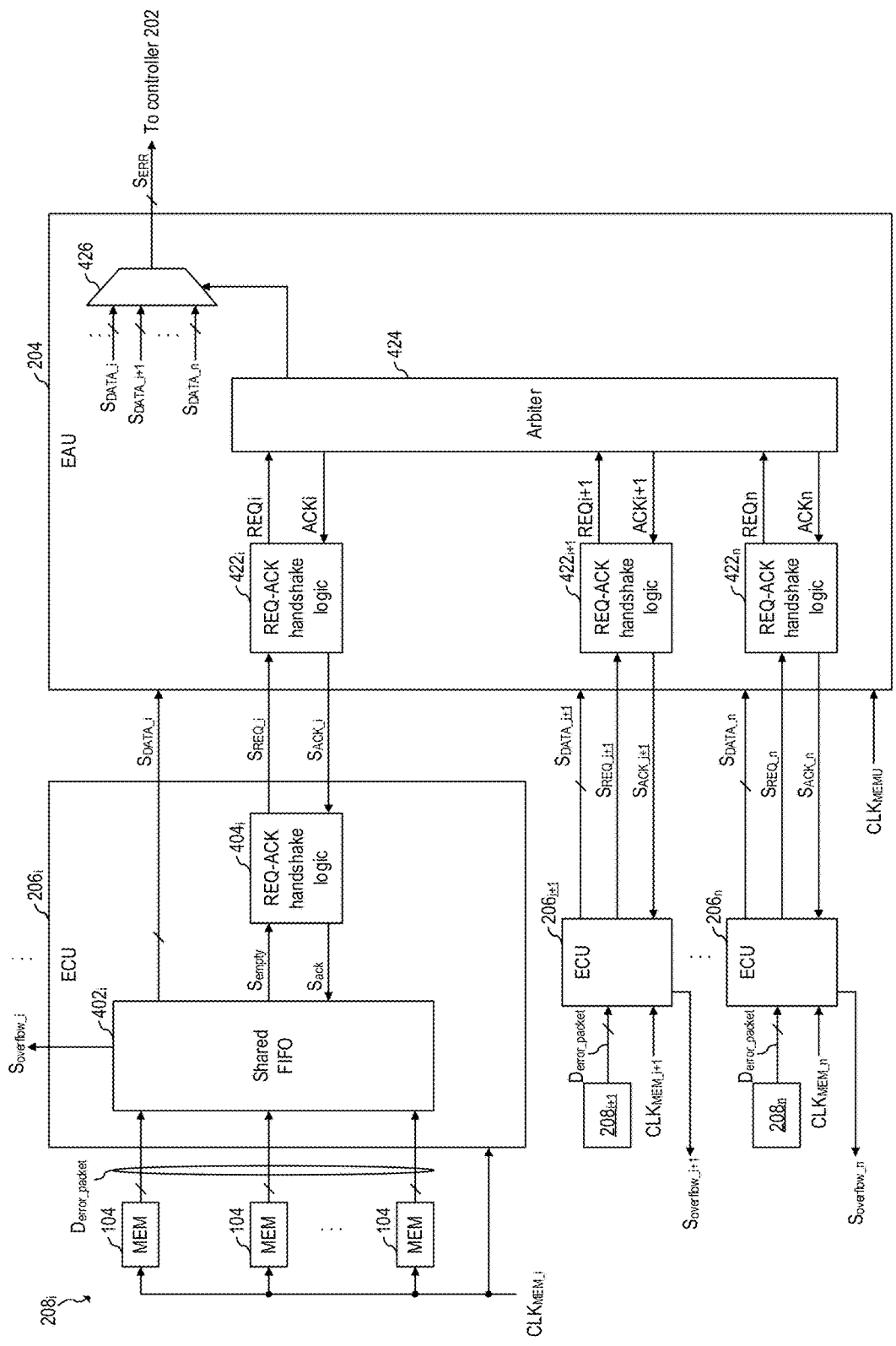
FIG. 4 shows a possible implementations of the error compactor unit (ECU) and error aggregator unit (EAU) of FIG. 2, according to an embodiment of the present invention.

FIG. 4 shows a possible implementations of ECUs 206 and EAU 204, according to an embodiment of the present invention. As shown in FIG. 4, SoC 100 includes n ECUs 206, where n is greater than 1. Each ECU 206 includes a multi-write shared FIFO 402 and a handshake circuit 404. EAU 204 includes a plurality of handshake circuits 422 coupled to respective ECUs 206, arbiter 424 and selector circuit 426.

Figure 5:
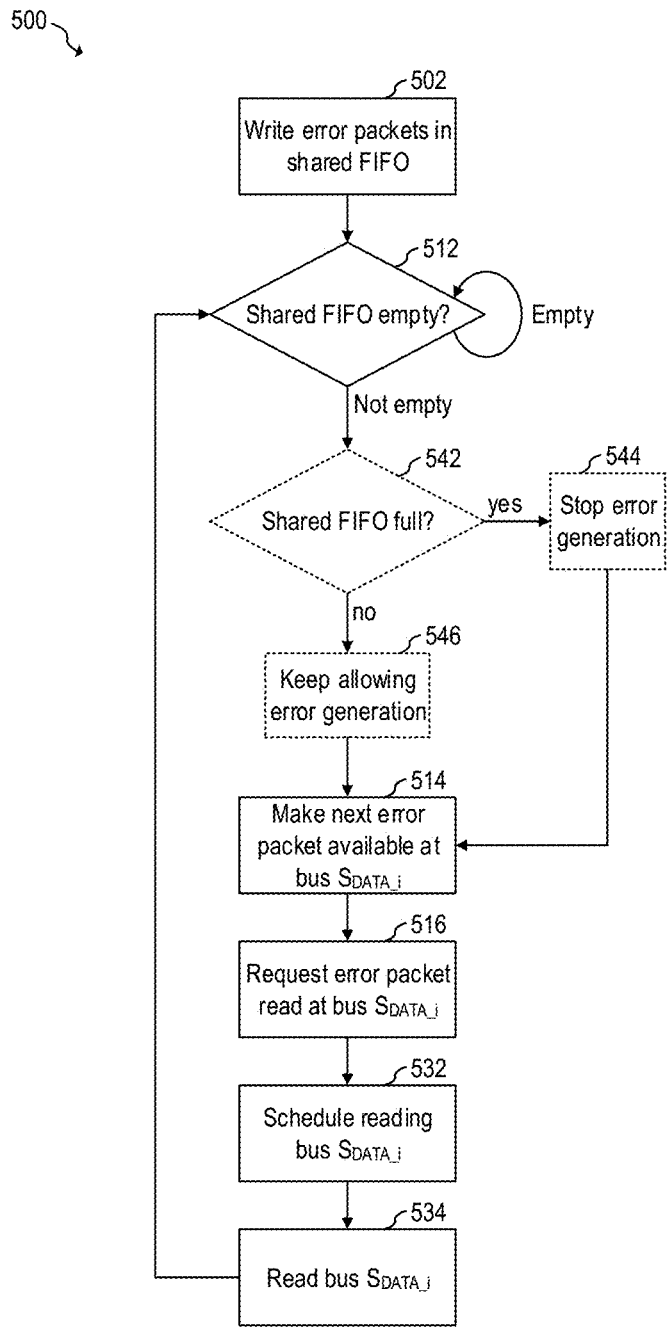
FIG. 5 shows a flow chart of an embodiment method for capturing memory errors, according to an embodiment of the present invention.

FIG. 5 shows a flow chart of embodiment method 500 for capturing memory errors, according to an embodiment of the present invention. Method 500 may be performed at startup or during runtime.

FIGS. 4 and 5 may be understood together. Although FIGS. 4 and 5 are explained with respect to ECU $206_i$, it is understood that ECU $206_i$ could be any ECU of SoC 100.

During step 502, when a memory 104 of sub-group $208_i$ detects a fault/error, such memory 104 writes into multi-write shared FIFO 402; a corresponding error packet (e.g., with the form of error packet 300 or 320). In some embodiments, multiple memories 104 of sub-group $208_i$ simultaneously write respective error packets into multi-write shared FIFO $402_i$.

In some embodiments, FIFO 402 may be a dedicated (non-shared FIFO). For example, in some embodiments, a dedicated FIFO 402 may be used to when an error source (e.g., a particular memory 104) is physically or clock-wise distinct from other error sources.

During step 512, a determination of whether shared FIFO $402_i$ is empty is performed. When shared FIFO $402_i$ is not empty, shared FIFO $402_i$ makes the next error packet available at bus $S_{DATA\_i}$ (e.g., in a first-in-first-out manner) during step 514 and requests EAU 204 to read bus $S_{DATA\_i}$ during step 516.

In some embodiments, bus $S_{DATA\_i}$ is a parallel bus (e.g., having 42 parallel lines for error packet 300). In other embodiments, bus $S_{DATA\_i}$ is a serial bus.

In some embodiments, signal $S_{empty}$ is deasserted (e.g., transitions from high to low) during step 512 when shared FIFO $402_i$ is not empty. In other embodiments, shared FIFO $402_i$ may signal that it is not empty in other ways, e.g., such as by asserting a $S_{non-empty}$ signal (e.g., from low to high).

In some embodiments, ECU 2061 requests that bus $S_{DATA\_i}$ be read during step 516 by asserting signal $S_{REQ\_i}$ (e.g., by transitioning signal $S_{REQ\_i}$ from low to high) using handshake circuit $404_i$.

During step 532, the read of bus $S_{DATA\_i}$ is scheduled. For example, in some embodiments, EAU 204 receives signal $S_{REQ\_i}$ with a corresponding handshake circuit 422. Upon reception of signal $S_{REQ\_i}$ (e.g., when $S_{REQi}$ is asserted), handshake circuit 422 signals arbiter 424 that an error packet is available in bus $S_{DATA\_i}$ (e.g., by asserting signal REQi by, e.g., transitioning signal REQi from low to high). Arbiter 424 schedules the read of bus $S_{DATA\_i}$, e.g., in a round robin manner or priority based manner (e.g., if a REQi is set to be highest priority, then all its errors are read before moving to REQ(i+1)), based on read requests REQ received from other handshake circuits 422.

When it is the turn to read the error packet available at bus $S_{DATA\_i}$, EAU 204 reads the error packet at bus $S_{DATA\_i}$ during step 534. For example, in some embodiments, arbiter selects bus $S_{DATA\_i}$ for reading using selector circuit 426 and transmits the selected error packet to controller 202 using bus $S_{ERR}$. In some embodiments, bus $S_{ERR}$ is a parallel bus. In other embodiments, bus $S_{ERR}$ is a serial bus. In some embodiments, arbiter 424 is capable of processing and acknowledging a request from the ECUs 206 every clock cycle of clock $CLK_{MEMU}$.

Once the error packet at bus $S_{DATA\_i}$ is read, step 512 is performed again, repeating the sequence. For example, in some embodiments, once the error packet at bus $S_{DATA\_i}$ is read, arbiter 424 asserts signal ACKi (e.g., by transitioning signal ACKi from low to high). When signal $ACK_i$ is asserted, handshake circuit $422_i$ asserts signal $S_{ACK\_i}$. When signal $S_{ACK\_i}$ is asserted, handshake circuit $404_i$ asserts signal $S_{ack}$ to indicate that the error packet at bus $S_{DATA\_i}$ have been read.

In some embodiments, when the shared FIFO $402_i$ is not empty after step 534, signal $S_{empty}$ is toggled to cause handshake circuit $404_i$ to assert (e.g., toggle, or cause a rising edge, or cause falling edge) signal $S_{REQ\_i}$. In some embodiments, handshake circuit $404i$ asserts $S_{REQ\_i}$ each time shared FIFO $402_i$ makes a new error packet available in bus $S_{DATA\_i}$ without toggling signal $S_{empty}$.

Some embodiments may also perform steps 542, 544, and 546 for flow control. For example, in some embodiments, when it is determined during step 542 that the shared FIFO is full, the error sources (e.g., memories 104 associated with the shared FIFO 402) are stopped (e.g., the MBIST is paused), to prevent an overflow of the FIFO buffer.

In some embodiments, when the shared FIFO overflows (e.g., when the FIFO buffer drops an error packet because, e.g., the FIFO buffer received an error packet when full), an error signal (e.g., $S_{overflow}$) is asserted, e.g., to indicate that an error packet was lost.

In some embodiments, step 502 is performed by one or more memories 104 of sub-group $208_i$, steps 512, 514, and 516 are performed by ECU 2061, and steps 532 and 534 are performed by EAU 204.

Multi-write shared FIFO 402; may be implemented in any way known in the art. For example, in some embodiments, shared FIFO 402i operates in a synchronous manner and the read and write clocks are the same (e.g., $CLK_{MEM\_i}$). In some embodiments, multi-write shared FIFO 402i is implemented as a multiple write ports (e.g., one for each memory 104 of sub-group 208i) and a single read port (e.g., bus $S_{DATA\_i}$). In some embodiments, other types of buffers, such as a last-in-first-out (LIFO) may be used.

Arbiter 424 may be implemented, e.g., with a state machine, and may implement a round robin scheduling scheme. Some embodiments may implement other scheduling schemes, such as first-come-first-serve (FCFS), a priority scheduling, or other type of scheduling schemes.

In some embodiments, the handshaking mechanism (e.g., as illustrated in steps 512, 514, 516, 632, and 534) results in variable execution time, e.g., since the memory test may be paused and/or the flow of error packets may be asynchronous and based on a scheduling scheme that may vary based on when the error packets are issued.

As shown in FIG. 4, the memories 104 of sub-group 208i and ECU $206_i$ operate in a first clock domain (e.g., based on clock $CLK_{MEM\_i}$) and EAU 204 operates in a second clock domain (e.g., based on $CLK_{MEMU}$). In some embodiments, clocks $CLK_{MEM\_i}$ and $CLK_{MEMU}$ are equal. In other embodiments, clocks $CLK_{MEM\_i}$ and $CLK_{MEMU}$ are different.

In some embodiments, the handshaking mechanism (e.g., as illustrated in steps 512, 514, 516, 632, and 534) advantageously allows error packets to flow from the first clock domain to the second clock domain when clocks $CLK_{MEM\_i}$ and $CLK_{MEMU}$ are different.

In some embodiments, the handshaking mechanism also advantageously allows for minimizing or eliminating the loss of error packets, since the error packets can be accumulated in shared FIFO $402_i$ until MEMU 102 is read to read them.

Selector circuit 426 may be implemented with a multiplexer (MUX). In some embodiments, selector circuit 426 samples the error packet and stores it (e.g., temporarily) in a table before transmitting the error packet via bus $S_{ERR}$. In some embodiments, keeping available the error packet of shared FIFO $402_i$ at bus $S_{DATA\_i}$ until handshake circuit $422_i$ issues an acknowledge (e.g., by asserting $S_{ACK\_i}$) advantageously allows for sampling the error packet at bus $S_{DATA\_i}$ while the bus $S_{DATA\_i}$ is stable, thereby avoiding metastability issues.

It is possible that shared FIFO 402; becomes full while memories 104 of sub-group $208_i$ continue to attempt to write error packets into shared FIFO $402_i$. In some embodiments, such scenario may be more likely to happen, e.g., during startup (since all memories 104 are tested, e.g., in parallel). In some embodiments, shared FIFO $402_i$ asserts a signal $S_{overflow}$ when it loses a packet (e.g., when a memory 104 attempts to write an error packet into shared FIFO $402_i$ when shared FIFO $402_i$ is full). In some embodiments, the startup test may be restarted (e.g., at a lower speed) when signal $S_{overflow}$ from any ECU 206 is asserted (e.g., when signal $S_{overflow}$ transitions from low to high).

In some embodiments, each ECU 206 is advantageously placed as close as possible to the memories 104 of the corresponding sub-group 208 to, e.g., avoid long interconnects and routing congestion.

In some embodiments, the use of ECUs 206 allows for a tree-like structure for the routing of error packets that advantageously allows MEMU 102 to be placed at a desirable physical location (e.g., in a corner of SoC 100), since the number of interconnects between ECUs 206 and MEMU 102 is substantially lower than the number of interconnects from all memories 104.

Advantages of some embodiments include ease of implementation of, e.g., clock tree and timing closure, as well as improved routing congestion. For example, in some embodiments, a reduction of MEMU channels may be higher than 80% when compared with an architecture that routes error packets directly from each memory to the MEMU.

Some embodiments may advantageously result in smaller area, e.g., because of the reduction in interconnects routing, as well as on the freedom of placement of MEMU, e.g., without impacting performance. Some embodiments may advantageously result in lower probably of error packet loss, leading to better safety and reliability of the product/application.

Some embodiments may also implement distributed MEMU units having multiple local MEMUs responsible for memories within a local cluster, which may advantageously increase performance as well as response time.

Figure 6A:
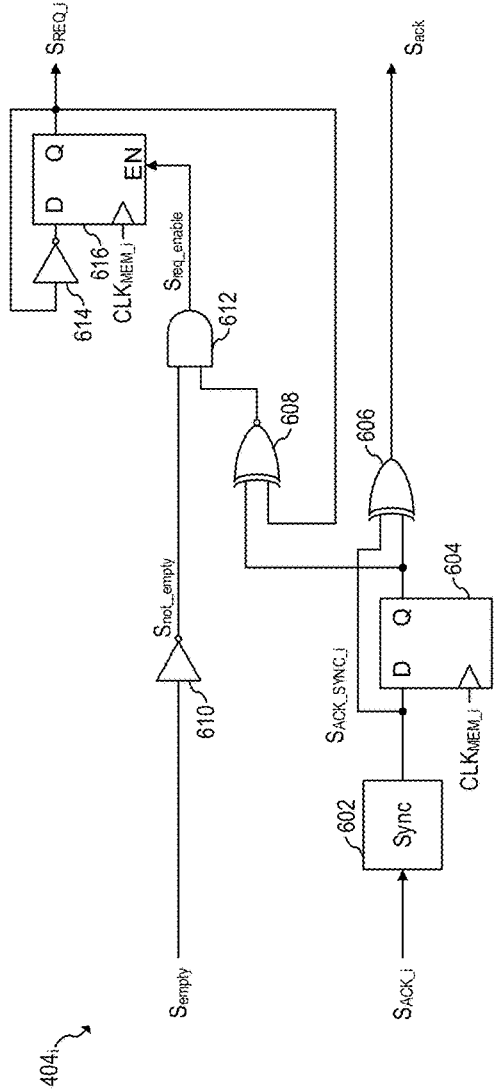
FIG. 6A shows a possible implementation of the handshake circuit of the ECU of FIG. 4, according to an embodiment of the present invention.

FIG. 6A shows a possible implementation of handshake circuit $404_i$, according to an embodiment of the present invention. Other implementations are also possible.

Figure 6B:
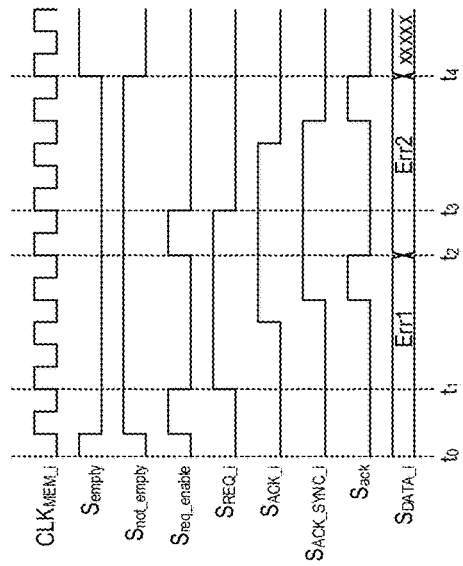
FIG. 6B shows exemplary waveforms associated with the handshake circuit of FIG. 6A, according to an embodiment of the present invention.

FIG. 6B shows exemplary waveforms associated with the handshake circuit $404_i$ of FIG. 6A, according to an embodiment of the present invention. FIG. 6A may be understood in view of FIG. 6B.

As shown in FIG. 6A, handshake circuit $404_i$ includes flip-flops 604 and 616, AND gate 612, inverters 61o and 614, XOR gate 606, XNOR gate 608, and synchronization logic 602.

During normal operation, when shared FIFO $402_i$ is empty (e.g., at time $t_o$ in FIG. 6B), flip-flop 616 is disabled.

When shared FIFO 402, is not empty (e.g., when signal $S_{empty}$ is low), signal $S_{REQ\_i}$ toggles (is asserted) each time signal $S_{ACK}$ is asserted (e.g., when signal $S_{ACK\_i}$ is pulsed). For example, in FIG. 6B, signal $S_{REQ\_i}$ is asserted at times $t_i$ and $t_3$.

As also shown in FIG. 6A, when signal $S_{ACK\_i}$ is asserted (e.g., toggles), signal $S_{ack}$ is also asserted (e.g., pulsed). As shown in FIG. 6B, each time signal Sack is asserted, a new error packet becomes available in bus $S_{DATA\_i}$ (such as at time $t_2$).

When the last error packet is read from shared FIFO $402_i$, signal $S_{empty}$ is asserted (such as at time $t_4$).

Figure 7A:
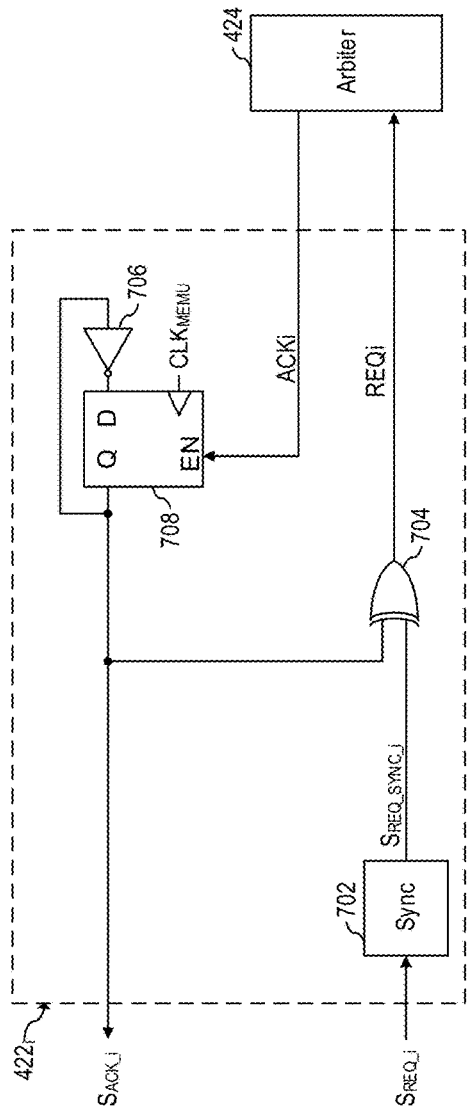
FIG. 7A shows a possible implementation of the handshake circuit of the EAU of FIG. 4, according to an embodiment of the present invention.

FIG. 7A shows a possible implementation of handshake circuit $422_i$, according to an embodiment of the present invention. Other implementations are also possible. For example, some embodiments may use a 4-level handshake scheme instead of a 2-level handshake scheme (as implemented by handshake circuit $422_i$)

Figure 7B:
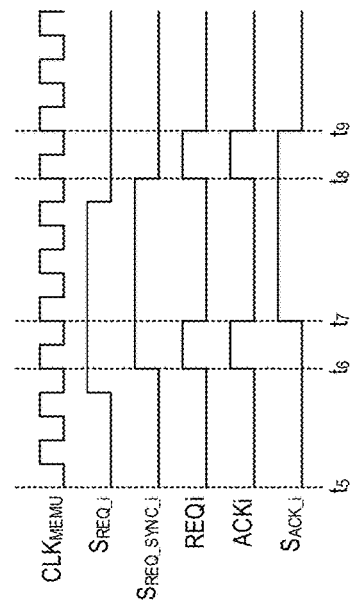
FIG. 7B shows exemplary waveforms associated with the handshake circuit of the EAU of FIG. 7A, according to an embodiment of the present invention.

FIG. 7B shows exemplary waveforms associated with the handshake circuit $422_i$ of FIG. 7A, according to an embodiment of the present invention. FIG. 7A may be understood in view of FIG. 7B.

As shown in FIG. 7A, handshake circuit $422_i$ includes flip-flop 708, inverter 706, XOR gate 704, and synchronization logic 702.

During normal operation, when signal $S_{REQ\_i}$ is asserted (e.g., toggles), signal REQi is also asserted (e.g., pulses), e.g., at times $t_6$ and $t_8$, thereby signaling arbiter 424 that data is available at bus $S_{DATA\_i}$.

Once the error packet is read at bus $S_{DATA\_i}$ (or concurrently with reading the error packet at bus $S_{DATAi}$), arbiter 424 causes signal $S_{ACK\_i}$ to be asserted (e.g., by toggling), such as at times $t_7$ and $t_9$. In some embodiments, arbiter 424 may initiate the process of asserting signal $S_{ACK\_i}$ upon reception of REQi by asserting (e.g., pulsing) signal ACKi (e.g., depending on the scheduling algorithm and loading of arbiter 424).

As can be seen from FIGS. 6A, 6B, 7A, and 7B, the implementations shown in FIGS. 6A and 7A are suitable to operating together.

Figure 8A:
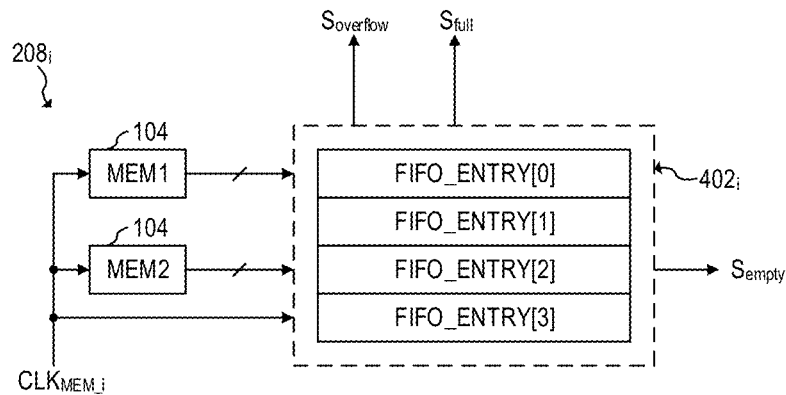
FIG. 8A shows a possible implementation of the multi-write shared FIFO of FIG. 4, according to an embodiment of the present invention.

FIG. 8A shows a possible implementation of multi-write shared FIFO $402_i$, according to an embodiment of the present invention. As shown in FIG. 8A, multi-write shared FIFO 402; may be implemented as a 4-deep FIFO. A FIFO buffer of a different size (e.g., with size 2, 3, 5, 8, 10, or higher), may also be used.

Figure 8B:
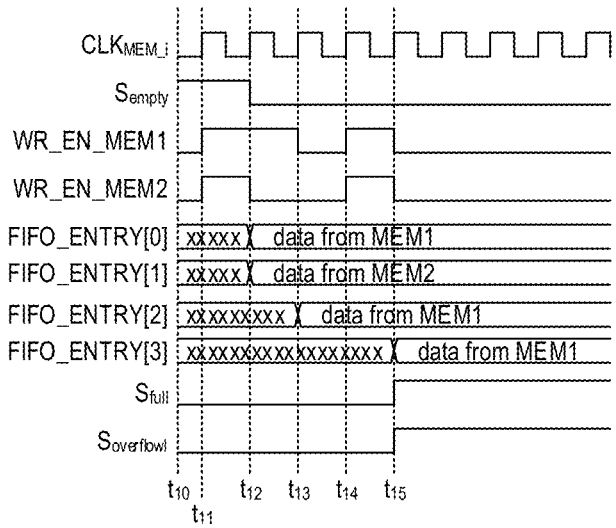
FIG. 8B shows exemplary waveforms associated with the multi-write FIFO of FIG. 8A, according to an embodiment of the present invention.

FIG. 8B shows exemplary waveforms associated with the multi-write FIFO $402_i$ of FIG. 8A, according to an embodiment of the present invention.

At time $t_{10}$, FIFO 402; of FIG. 8A is empty, as shown by signal $S_{empty}$.

At time $t_{11}$, memories MEM1 and MEM2 simultaneously begin writing FIFO_ENTRY[0] and FIFO_ENTRY[1], respectively. The written data is latched into the registers at time $t_{12}$.

At time $t_{12}$, MEM1 again begins writing the FIFO $402_i$ (now at location FIFO_ENTRY[2]).

At time t14, both MEM1 and MEM2 again begin writing the FIFO $402_i$. Since the FIFO can only store 4 error packets and at time $t_{15}$ the FIFO transitions from having 3 error packets to having 4 error packets (full) and losing 1 error packet (the second packet from MEM2 is not stored in the FIFO 402i), signals $S_{full}$ and $S_{overflow}$ are both asserted at time $t_{15}$.

In some embodiments, a signal $S_{flow\_control}$, e.g., from FIFO 402i, may be used to pause generation of error packets from the error sources to avoid reaching a condition in which $S_{overflow}$ is asserted. In some embodiments, $S_{flow\_control}$ may be asserted, e.g., when $S_{full}$ is asserted.

Figure 9:
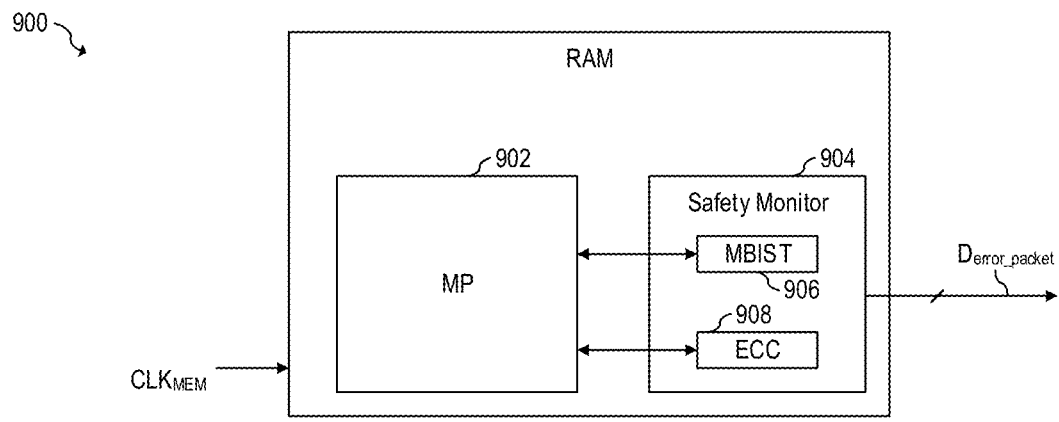
FIGS. 9 and 10 show schematic diagrams of memories, according to an embodiment of the present invention.
Figure 10:
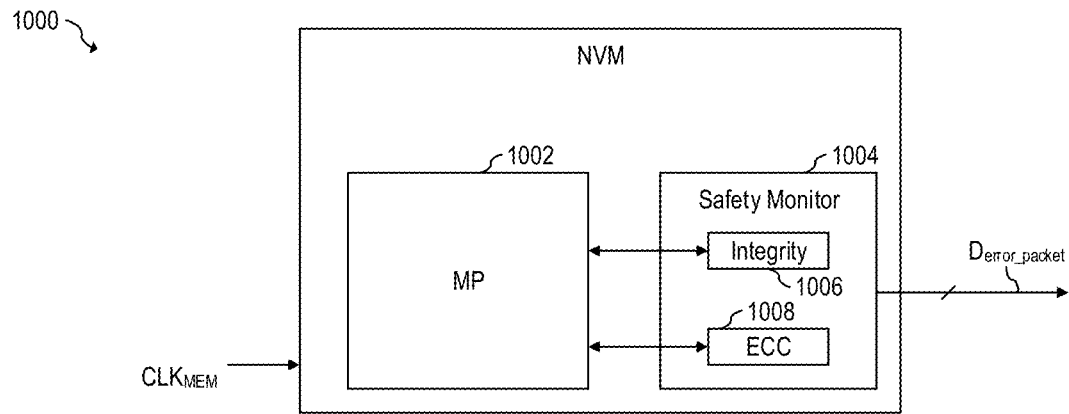

FIGS. 9 and 10 show schematic diagrams memories 900 and 1000, according to an embodiment of the present invention. Memories 104 may be implemented as memories 900 or 1000.

As shown in FIG. 9, memory 900 is of the volatile memory type and includes memory plane 902, and safety monitor 904. Safety monitor is configured to test memory plane 902 during startup using MBIST circuit 906 and during runtime using ECC circuit 908.

As shown in FIG. 10, memory 1000 is of the non-volatile memory (NVM) type and includes memory plane 1002, and safety monitor 1004. Safety monitor is configured to test memory plane 902 during startup using integrity test circuit 1006 and during runtime using ECC circuit 1008.

MBIST circuit 906 is configured to perform an MBIST test, and may be implemented in any way known in the art. Integrity test circuit 1006 is configured to perform a memory integrity test and may be implemented in any way known in the art. ECC circuits 908 and 1008 are configured to perform ECC tests and may be implemented in any way known in the art.

Figure 11:
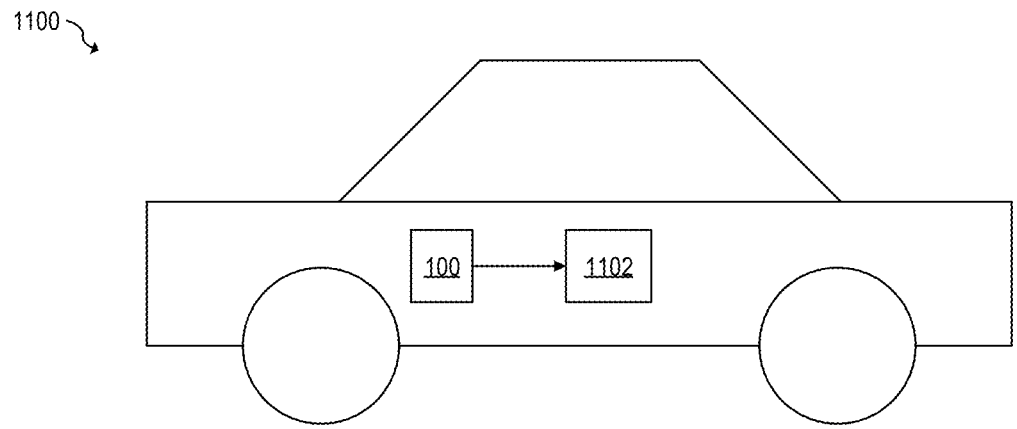
FIG. 11 shows a car having the SoC of FIG. 2 and a central processing unit, according to an embodiment of the present invention.

FIG. 11 shows car 1100 having SoC 100 and central processing unit 1102, according to an embodiment of the present invention.

When car 1100 is started (e.g., when the ignition key is inserted and turned), memories 104 are tested (e.g., with MBIST and integrity tests). Any faults detected in any of the memories 104 of SoC 100 are transmitted in error packets to MEMU 102 from corresponding ECUs 206. MEMU 102 then sequentially transmits information about the detected faults to central processing unit 1102. Central processing unit 1102 then may take an action based on the information received, such as prevent the start of the car 1100, turn on a light in a dashboard, or trigger a sound, for example.

During runtime (e.g., when car 1102 is being driven), ECC tests are performed on the memories 104 (e.g., as data is read and written into the memories 104. When fault are detected, (e.g., such as uncorrectable errors in one or more memories 104), the faults are transmitted in error packets to MEMU 102 from a corresponding ECUs 206. MEMU 102 then sequentially transmits information about the detected faults to central processing unit 1102. Central processing unit 1102 then may take an action based on the information received, such as turn on a light in a dashboard, or trigger a sound, for example.

Figure 12:
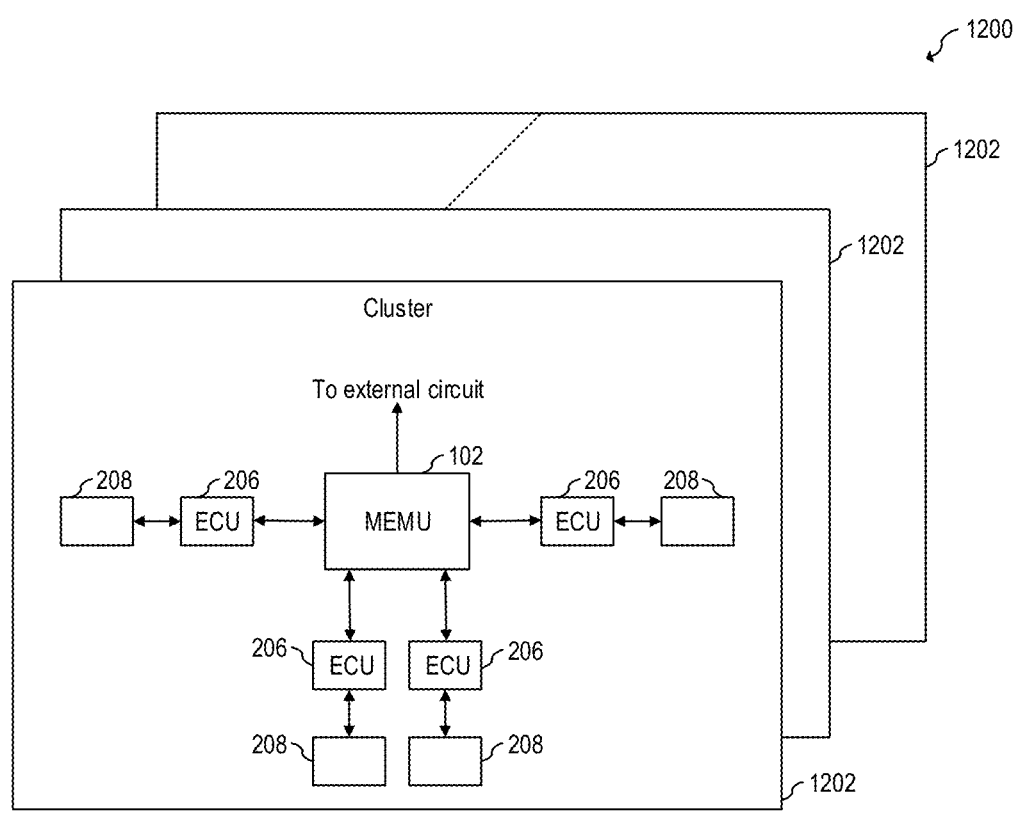
FIG. 12 shows a schematic diagram of an SoC, according to an embodiment of the present invention.

FIG. 12 shows a schematic diagram of the SoC 1200, according to an embodiment of the present invention. As shown in FIG. 12, SoC 1200 includes a plurality of local clusters 1202. Each local cluster 1202 includes a local MEMU 102, a plurality of ECUs 206, and a plurality of memories 104 arranged in a plurality of sub-groups 208. SoC 100 may be implemented as SoC 1200.

In some embodiments, the MEMU 102 and the plurality of ECUs 206 and sub-groups 208 of each local cluster 1202 operate in a similar manner as described with respect to FIG.

2. By having a plurality of local MEMUs 102, some embodiments advantageously achieve localized MEMU control and response, and further optimization of wires and response time (e.g., by optimizing the physical location in the substrate of the memories 104, ECUs 206 and MEMUs 102 to, e.g., minimize routing). In some embodiments, segregation of components is achieved by implementing the segregated components in a particular cluster 1202.

Example embodiments of the present invention are summarized here. Other embodiments can also be understood from the entirety of the specification and the claims filed herein.

Example 1. A method for capturing memory errors, the method including: receiving, with a first buffer of a first error compactor unit (ECU) circuit, a first memory error packet associated with a first memory; receiving, with the first buffer, a second memory error packet associated with a second memory; transmitting a first reading request for reading the first memory error packet; receiving the first reading request with an arbiter circuit of an error aggregator unit (EAU) circuit of a central memory error management unit (MEMU) circuit; in response to receiving the first reading request, reading the first memory error packet from the first buffer, transmitting the first memory error packet to a controller of the central MEMU circuit, and transmitting a first acknowledgement to the first ECU circuit; receiving the first acknowledgement with the first ECU circuit; and in response to receiving the first acknowledgement, transmitting a second reading request for reading the second memory error packet.

Example 2. The method of example 1, further including: receiving, with a second buffer of a second ECU circuit, a third memory error packet associated with a third memory; transmitting a third reading request for reading the third memory error packet; receiving the second reading request with the arbiter circuit; receiving the third reading request with the arbiter circuit; and sequentially reading the second and third memory error packets based on a sequence determined by the arbiter circuit.

Example 3. The method of one of examples 1 or 2, where the determined sequence is based on a round robin scheme.

Example 4. The method of one of examples 1 or 2, where the determined sequence is based on a priority-based arbitration scheme.

Example 5. The method of one of examples 1 to 4, where the first buffer is a multi-write buffer.

Example 6. The method of one of examples 1 to 5, further including simultaneously writing the first buffer with the first and second memory error packets.

Example 7. The method of one of examples 1 to 6, where the first buffer is a first-in-first-out (FIFO) buffer.

Example 8. The method of one of examples 1 to 7, further including: performing a memory built-in-self-test (MBIST) on the first memory; and generating the first memory error packet based on a result of the MBIST.

Example 9. The method of one of examples 1 to 8, further including: starting a car; and performing the MBIST on the first memory during startup of the car.

Example 10. The method of one of examples 1 to 9, further including: performing an error-correcting code (ECC) test on the first memory; and generating the first memory error packet based on a result of the ECC test.

Example 11. The method of one of examples 1 to 10, further including: operating a car; and performing the ECC test on the first memory while operating the car.

Example 12. The method of one of examples 1 to 11, where reading the first memory error packet from the first buffer includes using a parallel bus.

Example 13. The method of one of examples 1 to 11, where reading the first memory error packet from the first buffer comprises using a serial bus.

Example 14. The method of one of examples 1 to 12, where the parallel bus is coupled between the first buffer and a selector circuit, the method further including controlling, by the arbiter circuit, the selector circuit to sequentially transmit error packets to the controller of the central MEMU circuit.

Example 15. The method of one of examples 1 to 14, where transmitting the first reading request includes toggling a first request signal, and where transmitting the first acknowledgement toggling a first acknowledge signal.

Example 16. The method of one of examples 1 to 15, further including: operating the first ECU circuit with a first clock; and operating the arbiter circuit with a second clock, where the first and second clocks have different frequencies.

Example 17. The method of one of examples 1 to 15, further including: operating the first ECU circuit with a first clock; and operating the arbiter circuit with a second clock, where the first and second clocks have the same frequency.

Example 18. The method of one of examples 1 to 17, where the first memory error packet has between 42 and 52 bits.

Example 19. A circuit including: a central memory error management unit (MEMU) circuit including an error aggregator unit (EAU) circuit; an error compactor unit (ECU) circuit coupled to the EAU circuit, the ECU circuit having a buffer; and first and second memories coupled to the ECU circuit, where the ECU circuit is configured to: receive, with the buffer, a first memory error packet from the first memory, receive, with the buffer, a second memory error packet from the second memory, make available in a parallel bus the first memory error packet and transmit a first reading request for reading the first memory error packet to the EAU circuit, after transmitting the first reading request, receive a first acknowledgement, and in response to receiving the first acknowledgement, make available in the parallel bus the second memory error packet and transmit a second reading request for reading the second memory error packet to the EAU.

Example 20. The circuit of example 19, where the ECU circuit includes first and second terminals and a first handshake circuit coupled between the buffer and the first and second terminals, where the ECU circuit is configured to transmit the first reading request via the first terminal and receive the first acknowledgement via the second terminal.

Example 21. The circuit of one of examples 19 or 20, where the first handshake circuit includes: a logic gate having a first input configured to receive from the buffer a first signal indicative of whether the buffer is empty, and an output coupled to the first terminal; and a flip-flop having an input coupled to the second terminal, and an output coupled to the buffer.

Example 22. The circuit of one of examples 19 to 21, where the EAU includes an arbiter circuit and a second handshake circuit coupled between the first handshake circuit and the arbiter circuit, the second handshake circuit including a flip-flop having an output coupled to the second terminal, and a logic gate having a first input coupled to the output of the flip-flop of the second handshake circuit, a second input coupled to the first terminal, and an output coupled to the arbiter circuit.

Example 23. An integrated circuit including: a central memory error management unit (MEMU) circuit including an error aggregator unit (EAU) circuit; a plurality of error compactor unit (ECU) circuits, each ECU circuit of the plurality of ECU circuits including a respective first-in-first-out (FIFO) buffer coupled to a respective parallel bus coupled to the EAU; and a plurality of memories divided into respective sub-groups, each sub-group coupled to a respective ECU circuit of the plurality of ECU circuits, where each ECU circuit of the plurality of ECU circuits is configured to: receive memory error packets from one or more memories of the respective sub-group, store the memory error packets in the respective FIFO buffer, when the respective FIFO buffer is not empty, make available in the respective parallel bus a next memory error packet stored in the FIFO buffer and transmit to the EAU a reading request, after transmitting the reading request, receive an acknowledgement, and in response to receiving the acknowledgement, make available in the respective parallel bus a next memory error packet stored in the FIFO buffer and transmit to the EAU a new reading request.

Example 24. The integrated circuit of example 23, where the MEMU circuit includes a controller, where the EAU circuit includes an arbiter circuit configured to: receive reading requests from the plurality of ECU circuits; sequentially read memory error packets from the parallel buses coupled to the FIFO buffers of the plurality of ECU circuits; and sequentially transmit the memory error packets to the controller of the MEMU circuit.

Example 25. The integrated circuit of one of examples 23 or 24, further including: a further MEMU circuit including a further EAU circuit; a plurality of further ECU circuits, each further ECU circuit of the plurality of further ECU circuits including a respective first-in-first-out (FIFO) buffer coupled to a respective parallel bus coupled to the further EAU circuit; and a plurality of further memories divided into respective further sub-groups, each further sub-group coupled to a respective further ECU circuit of the plurality of further ECU circuits, where each further ECU circuit of the plurality of further ECU circuits is configured to: receive memory error packets from one or more further memories of the respective further sub-group, store the memory error packets in the respective FIFO buffer, when the respective FIFO buffer is not empty, make available in the respective parallel bus a next memory error packet stored in the FIFO buffer and transmit to the further EAU circuit a reading request, after transmitting the reading request to the further EAU circuit, receive an acknowledgement from the further EAU circuit, and in response to receiving the acknowledgement from the further EAU circuit, make available in the respective parallel bus a next memory error packet stored in the FIFO buffer and transmit to the further EAU circuit a new reading request.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for capturing memory errors, the method comprising:
receiving, with a first buffer of a first error compactor unit (ECU) circuit, a first memory error packet associated with a first memory;
receiving, with the first buffer, a second memory error packet associated with a second memory;
transmitting a first reading request for reading the first memory error packet;
receiving the first reading request with an arbiter circuit of an error aggregator unit (EAU) circuit of a central memory error management unit (MEMU) circuit;
in response to receiving the first reading request, reading the first memory error packet from the first buffer, transmitting the first memory error packet to a controller of the central MEMU circuit, and transmitting a first acknowledgement to the first ECU circuit;
receiving the first acknowledgement with the first ECU circuit; and
in response to receiving the first acknowledgement, transmitting a second reading request for reading the second memory error packet.

2. The method of claim 1, further comprising:
receiving, with a second buffer of a second ECU circuit, a third memory error packet associated with a third memory;
transmitting a third reading request for reading the third memory error packet;
receiving the second reading request with the arbiter circuit;
receiving the third reading request with the arbiter circuit; and
sequentially reading the second and third memory error packets based on a sequence determined by the arbiter circuit.

3. The method of claim 2, wherein the determined sequence is based on a round robin scheme.

4. The method of claim 2, wherein the determined sequence is based on a priority-based arbitration scheme.

5. The method of claim 1, wherein the first buffer is a multi-write buffer.

6. The method of claim 1, further comprising simultaneously writing the first buffer with the first and second memory error packets.

7. The method of claim 1, wherein the first buffer is a first-in-first-out (FIFO) buffer.

8. The method of claim 1, further comprising:
performing a memory built-in-self-test (MBIST) on the first memory; and
generating the first memory error packet based on a result of the MBIST.

9. The method of claim 8, further comprising:
starting a car; and
performing the MBIST on the first memory during startup of the car.

10. The method of claim 1, further comprising:
performing an error-correcting code (ECC) test on the first memory; and
generating the first memory error packet based on a result of the ECC test.

11. The method of claim 10, further comprising:
operating a car; and
performing the ECC test on the first memory while operating the car.

12. The method of claim 1, wherein reading the first memory error packet from the first buffer comprises using a parallel bus.

13. The method of claim 12, wherein the parallel bus is coupled between the first buffer and a selector circuit, the method further comprising controlling, by the arbiter circuit, the selector circuit to sequentially transmit error packets to the controller of the central MEMU circuit.

14. The method of claim 1, wherein reading the first memory error packet from the first buffer comprises using a serial bus.

15. The method of claim 1, wherein transmitting the first reading request comprises toggling a first request signal, and wherein transmitting the first acknowledgement toggling a first acknowledge signal.

16. The method of claim 1, further comprising:
operating the first ECU circuit with a first clock; and
operating the arbiter circuit with a second clock, wherein the first and second clocks have different frequencies.

17. The method of claim 1, further comprising:
operating the first ECU circuit with a first clock; and
operating the arbiter circuit with a second clock, wherein the first and second clocks have the same frequency.

18. The method of claim 1, wherein the first memory error packet has between 42 and 52 bits.

19. A circuit comprising:
a central memory error management unit (MEMU) circuit comprising an error aggregator unit (EAU) circuit;
an error compactor unit (ECU) circuit coupled to the EAU circuit, the ECU circuit having a buffer; and
first and second memories coupled to the ECU circuit, wherein the ECU circuit is configured to:
receive, with the buffer, a first memory error packet from the first memory,
receive, with the buffer, a second memory error packet from the second memory,
make available in a parallel bus the first memory error packet and transmit a first reading request for reading the first memory error packet to the EAU circuit,
after transmitting the first reading request, receive a first acknowledgement, and
in response to receiving the first acknowledgement, make available in the parallel bus the second memory error packet and transmit a second reading request for reading the second memory error packet to the EAU.

20. The circuit of claim 19, wherein the ECU circuit comprises first and second terminals and a first handshake circuit coupled between the buffer and the first and second terminals, wherein the ECU circuit is configured to transmit the first reading request via the first terminal and receive the first acknowledgement via the second terminal.

21. The circuit of claim 20, wherein the first handshake circuit comprises:
a logic gate having a first input configured to receive from the buffer a first signal indicative of whether the buffer is empty, and an output coupled to the first terminal; and
a flip-flop having an input coupled to the second terminal, and an output coupled to the buffer.

22. The circuit of claim 20, wherein the EAU comprises an arbiter circuit and a second handshake circuit coupled between the first handshake circuit and the arbiter circuit, the second handshake circuit comprising a flip-flop having an output coupled to the second terminal, and a logic gate having a first input coupled to the output of the flip-flop of the second handshake circuit, a second input coupled to the first terminal, and an output coupled to the arbiter circuit.

23. An integrated circuit comprising:
a central memory error management unit (MEMU) circuit comprising an error aggregator unit (EAU) circuit;
a plurality of error compactor unit (ECU) circuits, each ECU circuit of the plurality of ECU circuits comprising a respective first-in-first-out (FIFO) buffer coupled to a respective parallel bus coupled to the EAU; and
a plurality of memories divided into respective sub-groups, each sub-group coupled to a respective ECU circuit of the plurality of ECU circuits, wherein each ECU circuit of the plurality of ECU circuits is configured to:
receive memory error packets from one or more memories of the respective sub-group,
store the memory error packets in the respective FIFO buffer,
when the respective FIFO buffer is not empty, make available in the respective parallel bus a next memory error packet stored in the FIFO buffer and transmit to the EAU a reading request,
after transmitting the reading request, receive an acknowledgement, and
in response to receiving the acknowledgement, make available in the respective parallel bus a next memory error packet stored in the FIFO buffer and transmit to the EAU a new reading request.

24. The integrated circuit of claim 23, wherein the MEMU circuit comprises a controller, wherein the EAU circuit comprises an arbiter circuit configured to:
receive reading requests from the plurality of ECU circuits;
sequentially read memory error packets from the parallel buses coupled to the FIFO buffers of the plurality of ECU circuits; and
sequentially transmit the memory error packets to the controller of the MEMU circuit.

25. The integrated circuit of claim 23, further comprising:
a further MEMU circuit comprising a further EAU circuit;
a plurality of further ECU circuits, each further ECU circuit of the plurality of further ECU circuits comprising a respective first-in-first-out (FIFO) buffer coupled to a respective parallel bus coupled to the further EAU circuit; and
a plurality of further memories divided into respective further sub-groups, each further sub-group coupled to a respective further ECU circuit of the plurality of further ECU circuits, wherein each further ECU circuit of the plurality of further ECU circuits is configured to:
receive memory error packets from one or more further memories of the respective further sub-group,
store the memory error packets in the respective FIFO buffer,
when the respective FIFO buffer is not empty, make available in the respective parallel bus a next memory error packet stored in the FIFO buffer and transmit to the further EAU circuit a reading request,
after transmitting the reading request to the further EAU circuit, receive an acknowledgement from the further EAU circuit, and
in response to receiving the acknowledgement from the further EAU circuit, make available in the respective parallel bus a next memory error packet stored in the FIFO buffer and transmit to the further EAU circuit a new reading request.

* * * * *